(12) United States Patent
Mochizuki et al.

(10) Patent No.: US 10,269,689 B2
(45) Date of Patent: Apr. 23, 2019

(54) THERMALLY CONDUCTIVE SHEET AND SEMICONDUCTOR DEVICE

(71) Applicant: SUMITOMO BAKELITE CO., LTD., Tokyo (JP)

(72) Inventors: Shunsuke Mochizuki, Tokyo (JP); Kazuya Kitagawa, Tokyo (JP); Yoji Shirato, Tokyo (JP); Keita Nagahashi, Tokyo (JP); Mika Tsuda, Tokyo (JP); Satoshi Maji, Utsunomiya (JP); Motomi Kurokawa, Aichi-ken (JP); Kazuya Hirasawa, Kariya (JP)

(73) Assignee: SUMITOMO BAKELITE COMPANY LIMITED, Tokyo (JP)

( * ) Notice: Subject to any disclaimer, the term of this patent is extended or adjusted under 35 U.S.C. 154(b) by 14 days.

(21) Appl. No.: 15/116,061

(22) PCT Filed: Jan. 28, 2015

(86) PCT No.: PCT/JP2015/052363
§ 371 (c)(1),
(2) Date: Aug. 2, 2016

(87) PCT Pub. No.: WO2015/115482
PCT Pub. Date: Aug. 6, 2015

(65) Prior Publication Data
US 2017/0162484 A1 Jun. 8, 2017

(30) Foreign Application Priority Data
Feb. 3, 2014 (JP) .................................. 2014-018633

(51) Int. Cl.
*H01L 23/00* (2006.01)
*H01L 23/31* (2006.01)
(Continued)

(52) U.S. Cl.
CPC .... *H01L 23/49568* (2013.01); *H01L 23/3121* (2013.01); *H01L 23/3735* (2013.01);
(Continued)

(58) Field of Classification Search
CPC .......... H01L 23/49568; H01L 23/3737; H01L 23/3735; H01L 23/3121; H01L 23/0655;
(Continued)

(56) References Cited

U.S. PATENT DOCUMENTS

2009/0188701 A1 7/2009 Tsuzuki et al.
2011/0135911 A1 6/2011 Maenaka et al.
(Continued)

FOREIGN PATENT DOCUMENTS

JP 2001-152029 A 6/2001
JP 2005-306718 A 11/2005
(Continued)

OTHER PUBLICATIONS

International Search Report dated Apr. 21, 2015, issued in counterpart International Application No. PCT/JP2015/052363 (2 pages).

*Primary Examiner* — Shane Fang
(74) *Attorney, Agent, or Firm* — Westerman, Hattori, Daniels & Adrian, LLP (57) ABSTRACT

A thermally conductive sheet of the present invention includes a thermosetting resin (A), and an inorganic filler material (B) which is dispersed in the thermosetting resin (A). In the thermally conductive sheet according to the present invention, the volume resistivity of the cured product of the thermally conductive sheet, which is measured one minute later after an applied voltage of 1000 V is applied thereto on the basis of JIS K 6911 and at a temperature of 175° C., is greater than or equal to $1.0 \times 10^8$ Ω·m.

6 Claims, 1 Drawing Sheet

(51) Int. Cl.
*H01L 23/373* (2006.01)
*H01L 23/433* (2006.01)
*H01L 23/495* (2006.01)
*H01L 25/065* (2006.01)

(52) U.S. Cl.
CPC ...... *H01L 23/3737* (2013.01); *H01L 23/4334* (2013.01); *H01L 23/49575* (2013.01); *H01L 25/0655* (2013.01); H01L 23/49548 (2013.01); H01L 24/32 (2013.01); H01L 24/48 (2013.01); H01L 24/73 (2013.01); H01L 2224/29139 (2013.01); H01L 2224/32245 (2013.01); H01L 2224/451 (2013.01); H01L 2224/48091 (2013.01); H01L 2224/48106 (2013.01); H01L 2224/48137 (2013.01); H01L 2224/48245 (2013.01); H01L 2224/48247 (2013.01); H01L 2224/73265 (2013.01); H01L 2924/00014 (2013.01); H01L 2924/0665 (2013.01); H01L 2924/13055 (2013.01); H01L 2924/181 (2013.01)

(58) Field of Classification Search
CPC . H01L 2224/32245; H01L 2224/48091; H01L 2224/48106; H01L 2224/48245; H01L 2224/48137; H01L 2224/29139; H01L 2224/0665; H01L 2224/73265; H01L 24/32

See application file for complete search history.

(56) References Cited

U.S. PATENT DOCUMENTS

| | | | |
|---|---|---|---|
| 2011/0262728 A1* | 10/2011 | Izutani | C08L 23/06 428/220 |
| 2013/0012621 A1* | 1/2013 | Yamamoto | C08K 3/10 523/445 |
| 2013/0189514 A1* | 7/2013 | Nishiyanna | H01L 23/145 428/323 |

FOREIGN PATENT DOCUMENTS

| JP | 2006-2076 A | 1/2006 |
|---|---|---|
| JP | 2008-163145 A | 7/2008 |
| JP | 2009-149770 A | 7/2009 |
| JP | 2011-178961 A | 9/2011 |
| JP | 2011-216619 A | 10/2011 |
| JP | 2012-15557 A | 1/2012 |

\* cited by examiner

THERMALLY CONDUCTIVE SHEET AND SEMICONDUCTOR DEVICE

TECHNICAL FIELD

The present invention relates to a thermally conductive sheet and a semiconductor device.

BACKGROUND ART

It is known in the related art that an inverter device or a power semiconductor device is configured by mounting electronic components including a semiconductor chip such as an insulated gate bipolar transistor (IGBT) or a diode, a resistor, a capacitor, and the like on a substrate.

These power control devices are applied to various devices depending on the breakdown voltage and the current capacity of the power control devices. Particularly, use of these power control devices is becoming widespread in various electrical machines in terms of recent environmental problems and promotion of saving energy.

It is particularly desired for an on-board power control device to be reduced in size, to occupy less space, and to be installed in an engine room. Inside the engine room is a harsh environment in which, for example, the temperature is high and is greatly changed, and thus a member that has more excellent thermal radiation properties and insulating properties at a high temperature is required in the engine room.

In Patent Document 1, for example, disclosed is a semiconductor device in which a semiconductor chip is mounted on a supportive body such as a lead frame, and the supportive body and a thermal radiator panel connected to heat sink are bonded together by an insulating resin layer.

RELATED DOCUMENT

Patent Document

[Patent Document 1] Japanese Unexamined Patent Publication No. 2011-216619

SUMMARY OF THE INVENTION

Such a semiconductor device, however, does not have sufficiently satisfactory insulating properties at a high temperature. Thus, it may be difficult to maintain insulating properties of the electronic components, in which case the performance of the semiconductor device decreases.

DESCRIPTION OF EMBODIMENTS

According to the present invention, there is provided a thermally conductive sheet that includes a thermosetting resin and an inorganic filler material which is dispersed in the thermosetting resin, in which the volume resistivity of the cured product of the thermally conductive sheet, which is measured one minute after a voltage of 1000 V is applied thereto on the basis of JIS K 6911 and at a temperature of 175° C., is greater than or equal to $1.0 \times 10^8$ Ω·m.

According to the present invention, there is provided a semiconductor device including a metal plate, a semiconductor chip that is disposed on a first face side of the metal plate, a thermally conductive material that is bonded to a second face of the metal plate opposite to the first face, and an encapsulating resin that encapsulates the semiconductor chip and the metal plate, in which the thermally conductive material is formed by the thermally conductive sheet.

According to the present invention, it is possible to provide a thermally conductive sheet that is capable of realizing a semiconductor device having high insulation reliability and to provide a semiconductor device having high insulation reliability.

BRIEF DESCRIPTION OF THE DRAWINGS

The above and other objects, features, and advantages of the present invention will be more apparent from the following description of certain preferred embodiments taken in conjunction with the accompanying drawings.

DESCRIPTION OF EMBODIMENTS

Hereinafter, an embodiment of the present invention will be described on the basis of the drawings. The same element is designated by the same reference numeral throughout the drawings, and a detailed description thereof will not be repeated. The drawings are for schematic purposes only and do not necessarily have the same dimensions and proportions as real-world dimensions and proportions. In addition, the word "to" used in a numerical range represents a range of greater than or equal to one and less than or equal to the other unless otherwise specified.

First, a thermally conductive sheet according to the present embodiment will be described.

The thermally conductive sheet according to the present embodiment includes a thermosetting resin (A) and an inorganic filler material (B) dispersed in the thermosetting resin (A).

The volume resistivity of the cured product of the thermally conductive sheet, which is measured one minute later after an applied voltage of 1000 V is applied thereto on the basis of JIS K 6911 and at a temperature of 175° C., is greater than or equal to $1.0 \times 10^8$ Ω·m, preferably greater than or equal to $1.0 \times 10^9$ Ω·m, and particularly preferably greater than or equal to $1.0 \times 10^{10}$ Ω·m. The upper limit of the volume resistivity at a temperature of 175° C. is not particularly limited and is, for example, less than or equal to $1.0 \times 10^{13}$ Ω·m. In the present embodiment, the cured product of the thermally conductive sheet is obtained through curing by heating the B-stage thermally conductive sheet at 180° C. under 10 MPa for 40 minutes.

The volume resistivity at a temperature of 175° C. represents an indicator of insulating properties at a high temperature in the thermally conductive sheet. That is, as the volume resistivity at a temperature of 175° C. becomes higher, insulating properties at a high temperature become excellent.

In the present embodiment, the thermally conductive sheet is in a B-stage. The thermally conductive sheet after being cured is called a "cured product of the thermally conductive sheet". The thermally conductive sheet after being applied to a semiconductor device and being cured is called a "thermally conductive material".

The thermally conductive sheet, for example, is disposed at a bonded interface in a semiconductor device where high thermal conductivity is required and enhances thermal conductivity from a heating element to a radiator. Accordingly, failure due to varying of characteristics of a semiconductor chip and the like is suppressed, and the stability of a semiconductor device is improved.

An example of a semiconductor device to which the thermally conductive sheet according to the present embodiment is applied is a semiconductor device having a structure in which a semiconductor chip is disposed on a heat sink (metal plate), and the thermally conductive material is disposed on the face of the heat sink opposite to the face to which the semiconductor chip is bonded.

Another example of a semiconductor device to which the thermally conductive sheet according to the present embodiment is applied is a semiconductor device that is provided with the thermally conductive material, a semiconductor chip bonded to one face of the thermally conductive material, a metal member bonded to the face of the thermally conductive material opposite to the one face, and an encapsulating resin encapsulating the thermally conductive material, the semiconductor chip, and the metal member.

It is apparent, from a review performed by the inventor, that the insulating properties of the cured product of the thermally conductive sheet can be improved to a certain extent by increasing the glass transition temperature of the cured product of the thermally conductive sheet. However, only increasing the glass transition temperature does not yield sufficient insulating properties at a high temperature.

Therefore, in consequence of a careful review with consideration of the above matter, the inventor found that the volume resistivity of the thermally conductive sheet at a high temperature is improved as the β-relaxation in the cured product of the thermally conductive sheet becomes smaller. The reason considered is that as the β-relaxation is lower, release of motion of conductive components in the cured product of the thermally conductive sheet is suppressed at a high temperature.

When the release of motion of the conductive components is suppressed, a decrease in the insulating properties of the cured product of the thermally conductive sheet due to a temperature increase can be suppressed. Thus, it is possible to achieve the above volume resistivity at a temperature of 175° C. by controlling the β-relaxation of the cured product of the thermally conductive sheet.

The thermally conductive sheet according to the present embodiment which satisfies the volume resistivity at a temperature of 175° C. can realize a semiconductor device that has excellent insulating properties of the thermally conductive sheet at a high temperature and has high insulation reliability.

The volume resistivity of the cured product of the thermally conductive sheet at a temperature of 175° C. according to the present embodiment may be controlled by appropriately adjusting types and mixing proportions of each component constituting the thermally conductive sheet and a method for manufacturing the thermally conductive sheet.

Factors exemplified in the present embodiment for controlling the volume resistivity at a temperature of 175° C. is, particularly, appropriate selection of the type of thermosetting resin (A), performance of aging on a resin varnish to which the thermosetting resin (A) and the inorganic filler material (B) are added, a heating condition in the aging, and the like.

In the cured product of the thermally conductive sheet according to the present embodiment, the total amount of ions that is measured by performing ion chromatography analysis on extracted water obtained under the following condition is preferably less than or equal to 30,000 ppm and more preferably less than or equal to 20,000 ppm.

The ions are one or two or more selected from $Li^+$, $Na^+$, $NH_4^+$, $K^+$, $Ca^{2+}$, $Mg^{2+}$, $F^-$, $Cl^-$, $NO_2^{2-}$, $Br^-$, $NO_3^-$, $PO_4^{3-}$, $SO_4^{2-}$, $(COO)_2^{2-}$, $CH_3COO^-$, and $HCOO^-$.

(Condition)

Add 40 mL of pure water to 2 g of the cryogenically ground cured product of the thermally conductive sheet, and perform hot water extraction at 125° C. for 20 hours to obtain extracted water.

The insulating properties of the thermally conductive sheet can be further improved at a high temperature because the total amount of the ions is less than or equal to the upper limit. The total amount of the ions in the cured product of the thermally conductive sheet can be adjusted by adjusting the amount of ionized impurities in each component constituting the thermally conductive sheet or, when the inorganic filler material that hydrolyzes and generates ions is included, by selecting the inorganic filler material that has a small surface area.

The cured product of the thermally conductive sheet according to the present embodiment has a glass transition temperature preferably greater than or equal to 175° C. and more preferably greater than or equal to 190° C., which is measured through dynamic viscoelasticity measurement under conditions of a rate of temperature increase of 5° C./min and a frequency of 1 Hz. The upper limit of the glass transition temperature is not particularly limited and is, for example, less than or equal to 300° C.

The glass transition temperature of the cured product of the thermally conductive sheet can be measured as follows. First, the cured product of the thermally conductive sheet is obtained by heating the thermally conductive sheet at 180° C. under 10 MPa for 40 minutes. Next, a glass transition temperature (Tg) of the cured product obtained is measured through dynamic viscoelasticity measurement (DMA) under conditions of a rate of temperature increase of 5° C./min and a frequency of 1 Hz.

When the glass transition temperature is greater than or equal to the lower limit, release of movement of conductive components can be further suppressed, and thus a decrease in insulating properties of the thermally conductive sheet due to temperature increase can be further suppressed. In consequence, it is possible to realize a semiconductor device having more excellent insulation reliability.

The glass transition temperature can be controlled by appropriately adjusting types and mixing proportions of each component constituting the thermally conductive sheet and adjusting a method for manufacturing the thermally conductive sheet.

The thermally conductive sheet according to the present embodiment, for example, is disposed between a heating element such as a semiconductor chip and a substrate such as a lead frame on which the heating element is mounted or an interconnect substrate (interposer) or between the substrate and a thermal radiation member such as a heat sink. Accordingly, heat generated from the heating element can be effectively radiated outside of a semiconductor device while the insulating properties of the semiconductor device are maintained. Thus, the insulation reliability of the semiconductor device can be improved.

The plan shape of the thermally conductive sheet according to the present embodiment is not particularly limited and is able to be appropriately selected in accordance with the shape of the thermal radiation member, the heating element, and the like. For example, the plan shape of the thermally conductive sheet can be rectangular. The film thickness of the cured product of the thermally conductive sheet is preferably greater than or equal to 50 μm and less than or equal to 250 µm. Accordingly, it is possible to transfer heat from the heating element more effectively to the thermal radiation member while improving mechanical strength and thermal resistance. Furthermore, the thermally conductive material has a more excellent balance of thermal radiation properties and insulating properties.

The thermally conductive sheet according to the present embodiment includes a thermosetting resin (A) and an inorganic filler material (B) dispersed in the thermosetting resin (A).

(Thermosetting Resin (A))

Examples of the thermosetting resin (A) include an epoxy resin having a dicyclopentadiene skeleton, an epoxy resin having a biphenyl skeleton, an epoxy resin having an adamantane skeleton, an epoxy resin having a phenol aralkyl skeleton, an epoxy resin having a biphenyl aralkyl skeleton, an epoxy resin having a naphthalene aralkyl skeleton, a cyanate resin, and the like.

One of the examples may be used alone as the thermosetting resin (A), or two or more thereof may be used together.

Using such a thermosetting resin (A), the cured product of the thermally conductive sheet according to the present embodiment can have a high glass transition temperature and an increase in the volume resistivity at a high temperature can be controlled by controlling the β-relaxation of the cured product of the thermally conductive sheet. The β-relaxation of the cured product of the thermally conductive sheet can be measured, for example, by the dielectric loss rate and the change in the relative dielectric constant.

The thermosetting resin (A) is particularly preferably an epoxy resin having a dicyclopentadiene skeleton in terms of further improving the volume resistivity at a temperature of 175° C.

The content of the thermosetting resin (A) in the thermally conductive sheet according to the present embodiment is preferably greater than or equal to 1 mass % and less than or equal to 30 mass % and more preferably greater than or equal to 5 mass % and less than or equal to 28 mass % with respect to the thermally conductive sheet as 100 mass %. When the content of the thermosetting resin (A) is greater than or equal to the lower limit, handling ability is improved, and forming the thermally conductive sheet is facilitated. When the content of the thermosetting resin (A) is less than or equal to the upper limit, strength and incombustibility of the thermally conductive sheet are further improved, and thermal conductivity of the thermally conductive sheet is further improved.

(Inorganic Filler Material (B))

Examples of the inorganic filler material (B) include silica, alumina, boron nitride, aluminum nitride, silicon nitride, and silicon carbide. One of these may be used alone, or two or more may be used together.

The inorganic filler material (B) is preferably secondary agglomerated particles that are formed by agglomerating primary particles of scaly boron nitride in terms of further improving thermal conductivity of the thermally conductive sheet according to the present embodiment.

Secondary agglomerated particles that are formed by agglomerating scaly boron nitride can be formed by, for example, agglomerating scaly boron nitride through spray drying or the like and baking the agglomerated scaly boron nitride. The baking temperature is, for example, 1200° C. to 2500° C.

As such, when secondary agglomerated particles obtained by sintering scaly boron nitride are used, an epoxy resin having a dicyclopentadiene skeleton is preferably used as the thermosetting resin (A) in terms of improving dispersibility of the inorganic filler material (B) in the thermosetting resin (A).

The average particle diameter of the secondary agglomerated particles that are formed by agglomerating scaly boron nitride is, for example, preferably greater than or equal to 5 µm and less than or equal to 180 µm and more preferably greater than or equal to 10 µm and less than or equal to 100 µm. Accordingly, it is possible to realize the thermally conductive sheet having a more excellent balance of thermal conductivity and insulating properties.

The average major diameter of the primary particles of scaly boron nitride constituting the secondary agglomerated particles is preferably greater than or equal to 0.01 µm and less than or equal to 20 µm and more preferably greater than or equal to 0.1 µm and less than or equal to 10 µm. Accordingly, it is possible to realize the thermally conductive sheet having a more excellent balance of thermal conductivity and insulating properties.

The average major diameter can be measured by using an electron micrograph. For example, the average major diameter is measured in the following procedure. First, the secondary agglomerated particles are cut by a microtome or the like to prepare a sample. Next, a section of the secondary agglomerated particles magnified by a few thousand times is captured several times by a scanning electron microscope. Next, an arbitrary one of the secondary agglomerated particles is selected, and the major diameter of a primary particle of the scaly boron nitride is measured from the pictures. At this time, the major diameter is measured for 10 or more primary particles, and the average value of the major diameters is used as the average major diameter.

The content of the inorganic filler material (B) in the thermally conductive sheet according to the present embodiment is preferably greater than or equal to 50 mass % and less than or equal to 95 mass %, more preferably greater than or equal to 55 mass % and less than or equal to 88 mass %, and particularly preferably greater than or equal to 60 mass % and less than or equal to 80 mass % with respect to the thermally conductive sheet as 100 mass %.

By setting the content of the inorganic filler material (B) to be greater than or equal to the lower limit, thermal conductivity and mechanical strength of the thermally conductive sheet can be improved more effectively. Meanwhile, by setting the content of the inorganic filler material (B) to be less than or equal to the upper limit, deposition and workability of a resin compound are improved, and uniformity of the film thickness of the thermally conductive sheet can be more favorable.

It is preferable that the inorganic filler material (B) according to the present embodiment further includes, in addition to the secondary agglomerated particles, primary particles of scaly boron nitride that are different from the primary particles of the scaly boron nitride constituting the secondary agglomerated particles in terms of further improving thermal conductivity of the thermally conductive sheet. The average major diameter of these primary particles of scaly boron nitride is preferably greater than or equal to 0.01 µm and less than or equal to 20 µm and more preferably greater than or equal to 0.1 µm and less than or equal to 10 µm.

Accordingly, it is possible to realize the thermally conductive sheet having a more excellent balance of thermal conductivity and insulating properties.

(Curing Agent (C))

It is preferable that the thermally conductive sheet according to the present embodiment further includes a curing agent (C) when an epoxy resin is used as the thermosetting resin (A).

One or more selected from a curing catalyst (C-1) and a phenol-based curing agent (C-2) can be used as the curing agent (C).

Examples of the curing catalyst (C-1) include an organometallic salt such as zinc naphthenate, cobalt naphthenate, tin octylate, cobalt octylate, bis acetylacetonate cobalt (II), and tris acetylacetonate cobalt (III); tertiary amines such as triethylamine, tributylamine, and 1,4-diazabicyclo[2.2.2]octane; imidazoles such as 2-phenyl-4-methylimidazole, 2-ethyl-4-methylimidazole, 2,4-diethylimidazole, 2-phenyl-4-methyl-5-hydroxyimidazole, and 2-phenyl-4,5-dihydroxymethylimidazole; organic phosphorus compounds such as triphenylphosphine, tri-p-tolylphosphine, tetraphenylphosphonium.tetraphenylborate, triphenylphosphine.triphenylborane, and 1,2-bis-(diphenylphosphino)ethane; phenol compounds such as phenol, bisphenol A, and nonylphenol; and organic acids such as acetic acid, benzoic acid, salicylic acid, and p-toluenesulfonic acid; or a mixture thereof. One of these examples including derivatives can be used alone as the curing catalyst (C-1), or two or more thereof including derivatives can be used together.

The content of the curing catalyst (C-1) in the thermally conductive sheet according to the present embodiment is not particularly limited and is preferably greater than or equal to 0.001 mass % and less than or equal to 1 mass % with respect to the thermally conductive sheet as 100 mass %.

Examples of the phenol-based curing agent (C-2) include a novolac phenol resin such as a phenol novolac resin, a cresol novolac resin, a naphthol novolac resin, an amino triazine novolac resin, a novolac resin, and a tris phenol methane phenol novolac resin; a modified phenol resin such as a terpene-modified phenol resin and a dicyclopentadiene-modified phenol resin; an aralkyl resin such as a phenol aralkyl resin having a phenylene skeleton and/or a biphenylene skeleton and a naphthol aralkyl resin having a phenylene skeleton and/or a biphenylene skeleton; bisphenol compounds such as bisphenol A and bisphenol F; and a resol phenol resin. One of these may be used alone as the phenol-based curing agent (C-2), or two or more thereof may be used together.

Among the examples, the phenol-based curing agent (C-2) is preferably a novolac phenol resin or a resol phenol resin in terms of increasing the glass transition temperature and decreasing a linear expansion coefficient.

The content of the phenol-based curing agent (C-2) is not particularly limited and is preferably greater than or equal to 1 mass % and less than or equal to 30 mass % and more preferably greater than or equal to 5 mass % and less than or equal to 15 mass % with respect to the thermally conductive sheet as 100 mass %.

(Coupling Agent (D))

The thermally conductive sheet according to the present embodiment may further include a coupling agent (D).

The coupling agent (D) can improve wettability of an interface between the thermosetting resin (A) and the inorganic filler material (B).

Any of coupling agents normally used can be used as the coupling agent (D). Specifically, one or more coupling agents selected from an epoxysilane coupling agent, a cationic silane coupling agent, an aminosilane coupling agent, a titanate-based coupling agent, and a silicone oil coupling agent are preferably used.

The additive content of the coupling agent (D) is not particularly limited since it is dependent on the specific surface area of the inorganic filler material (B) and is preferably greater than or equal to 0.1 parts by mass and less than or equal to 10 parts by mass and particularly preferably greater than or equal to 0.5 parts by mass and less than or equal to 7 parts by mass with respect to the inorganic filler material (B) as 100 parts by mass.

(Phenoxy Resin (E))

The thermally conductive sheet according to the present embodiment may further include a phenoxy resin (E). Including the phenoxy resin (E) can further improve flex resistance of the thermally conductive sheet.

In addition, including the phenoxy resin (E) can decrease the modulus of elasticity of the thermally conductive sheet and can improve stress relaxation force of the thermally conductive sheet.

When the phenoxy resin (E) is included, fluidity due to viscosity increase is decreased, and occurrence of voids and the like can be suppressed. In addition, adhesion between the thermally conductive sheet and the thermal radiation member can be improved. Owing to the synergistic effects, insulation reliability of a semiconductor device can be further increased.

Examples of the phenoxy resin (E) include a phenoxy resin having a bisphenol skeleton, a phenoxy resin having a naphthalene skeleton, a phenoxy resin having an anthracene skeleton, and a phenoxy resin having a biphenyl skeleton. In addition, a phenoxy resin having a structure including more than one of these skeletons can also be used.

The content of the phenoxy resin (E) is, for example, greater than or equal to 3 mass % and less than or equal to 10 mass % with respect to the thermally conductive sheet as 100 mass %.

(Other Components)

The thermally conductive sheet according to the present embodiment can include an antioxidant, a leveling agent, and the like to an extent without impairing the effect of the present invention.

The thermally conductive sheet according to the present embodiment can be prepared as follows.

First, each component above is added to a solvent to obtain a varnish resin compound. In the present embodiment, for example, a resin compound can be obtained by preparing a resin varnish through adding the thermosetting resin (A) and the like to a solvent, putting the inorganic filler material (B) into the resin varnish, and milling the inorganic filler material (B) and the resin varnish by using a three roll mill or the like. Accordingly, the inorganic filler material (B) can be more uniformly dispersed in the thermosetting resin (A).

Examples of the solvent include, although not particularly limited, methyl ethyl ketone, methyl isobutyl ketone, propylene glycol monomethyl ether, and cyclohexanone.

Next, the resin compound for the thermally conductive sheet is aged. Accordingly, the β-relaxation of the cured product of the thermally conductive sheet and an increase in the volume resistivity at a high temperature can be controlled. The estimated reason for this is, for example, an increase in the affinity of the inorganic filler material (B) with the thermosetting resin (A) due to aging. Aging can be performed under conditions of, for example, a temperature of 30° C. to 80° C. and a time of 12 to 24 hours.

Next, the resin compound is shaped into a sheet to form the thermally conductive sheet. In the present embodiment, the thermally conductive sheet can be obtained by, for example, applying the varnish resin compound onto a base material and then heating and drying the varnish resin compound and the base material. Examples of the base material include a metal foil that constitutes a thermal radiation member, a lead frame, a peelable carrier material, and the like. Heating for drying the resin compound is performed under conditions of, for example, a temperature of 80° C. to 150° C. and a time of five minutes to one hour. The film thickness of the resin sheet is, for example, greater than or equal to 60 μm and less than or equal to 500 μm.

Figure 1:
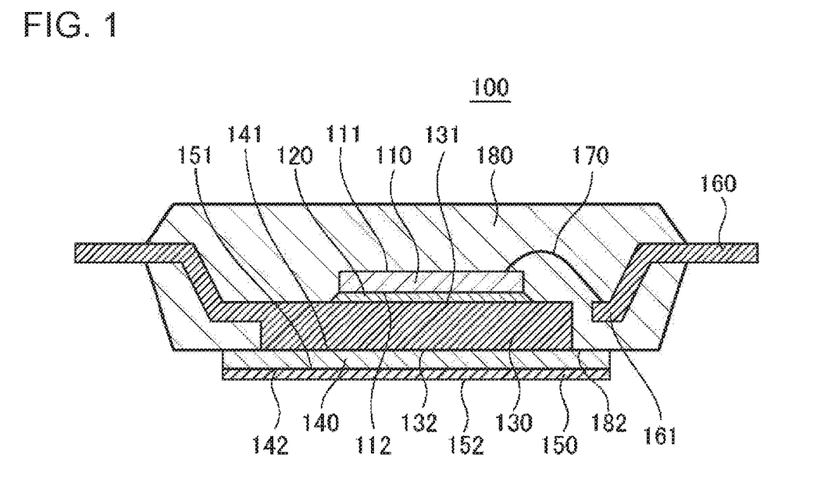
FIG. 1 is a sectional view of a semiconductor device according to one embodiment of the present invention.

Next, a semiconductor device according to the present embodiment will be described. FIG. 1 is a sectional view of a semiconductor device 100 according to one embodiment of the present invention.

For simplification of description, a positional relationship (up and down relationship and the like) of each element constituting the semiconductor device 100 may be described below as in the relationship illustrated in each drawing. However, the positional relationship in the description is irrelevant to a positional relationship at the time of use or manufacturing of the semiconductor device 100.

The present embodiment will be described in the case where a metal plate is used as a heat sink. The semiconductor device 100 according to the present embodiment is provided with a heat sink 130, a semiconductor chip 110 disposed on a first face 131 side of the heat sink 130, a thermally conductive material 140 bonded to a second face 132 of the heat sink 130 opposite to the first face 131, and an encapsulating resin 180 encapsulating the semiconductor chip 110 and the heat sink 130.

Hereinafter, details of the semiconductor device 100 will be described.

The semiconductor device 100, for example, includes a conductive layer 120, a metal layer 150, a lead 160, and a wire (metal interconnect) 170 in addition to the above configuration.

An unillustrated electrode pattern is formed on an upper face 111 of the semiconductor chip 110, and an unillustrated conductive pattern is formed on a lower face 112 of the semiconductor chip 110. The lower face 112 of the semiconductor chip 110 is fixed to the first face 131 of the heat sink 130 through the conductive layer 120 such as silver paste. The electrode pattern on the upper face 111 of the semiconductor chip 110 is electrically connected to an electrode 161 of the lead 160 through the wire 170.

The heat sink 130 is configured of metal.

The encapsulating resin 180 encapsulates a part of the wire 170, the conductive layer 120, and the lead 160 inside the encapsulating resin 180 in addition to the semiconductor chip 110 and the heat sink 130. The other part of each lead 160 protrudes outside the encapsulating resin 180 from a side face of the encapsulating resin 180. In the present embodiment, for example, a lower face 182 of the encapsulating resin 180 and the second face 132 of the heat sink 130 are positioned in the same plane.

An upper face 141 of the thermally conductive material 140 is attached to the second face 132 of the heat sink 130 and the lower face 182 of the encapsulating resin 180. That is, the encapsulating resin 180 is in contact with the face (upper face 141) on the heat sink 130 side of the thermally conductive material 140 around the heat sink 130.

An upper face 151 of the metal layer 150 is fixed to a lower face 142 of the thermally conductive material 140. That is, one face (upper face 151) of the metal layer 150 is fixed to the face (lower face 142) of the thermally conductive material 140 opposite to the heat sink 130 side.

It is preferable that the outline of the upper face 151 of the metal layer 150 overlaps with the outline of the face (lower face 142) of the thermally conductive material 140 opposite to the heat sink 130 side in a plan view.

The entire face (lower face 152) of the metal layer 150 opposite to the one face (upper face 151) is exposed from the encapsulating resin 180. In the present embodiment, the upper face 141 of the thermally conductive material 140 is attached to the second face 132 of the heat sink 130 and the lower face 182 of the encapsulating resin 180 as described above. Thus, the thermally conductive material 140 is exposed to the outside of the encapsulating resin 180 except for the upper face 141 thereof. The entire metal layer 150 is exposed to the outside of the encapsulating resin 180.

The second face 132 and the first face 131 of the heat sink 130, for example, are formed flat.

The mounted floor area of the semiconductor device 100, although not particularly limited, can be greater than or equal to 10×10 mm and less than or equal to 100×100 mm as an example. The mounted floor area of the semiconductor device 100 is the area of the lower face 152 of the metal layer 150.

The number of semiconductor chips 110 mounted on one heat sink 130 is not particularly limited. The number may be one or greater. For example, the number can be greater than or equal to three (six and the like). That is, for example, three or more semiconductor chips 110 may be disposed on the first face 131 side of one heat sink 130, and the encapsulating resin 180 may encapsulate all of these three or more semiconductor chips 110.

The semiconductor device 100 is, for example, a power semiconductor device. The semiconductor device 100 can be configured as 2-in-1 in which two semiconductor chips 110 are encapsulated in the encapsulating resin 180, 6-in-1 in which six semiconductor chips 110 are encapsulated in the encapsulating resin 180, or 7-in-1 in which seven semiconductor chips 110 are encapsulated in the encapsulating resin 180.

Next, an example of a method for manufacturing the semiconductor device 100 according to the present embodiment will be described.

First, the heat sink 130 and the semiconductor chip 110 are prepared, and the lower face 112 of the semiconductor chip 110 is fixed to the first face 131 of the heat sink 130 through the conductive layer 120 such as silver paste.

Next, a lead frame (not illustrated entirely) that includes the lead 160 is prepared, and the electrode pattern on the upper face 111 of the semiconductor chip 110 and the electrode 161 of the lead 160 are electrically connected through the wire 170.

Next, a part of the semiconductor chip 110, the conductive layer 120, the heat sink 130, the wire 170, and the lead 160 is encapsulated together by the encapsulating resin 180.

Next, the thermally conductive material 140 is prepared, and the upper face 141 of the thermally conductive material 140 is attached to the second face 132 of the heat sink 130 and the lower face 182 of the encapsulating resin 180. Furthermore, one face (upper face 151) of the metal layer 150 is fixed to the face (lower face 142) of the thermally conductive material 140 opposite to the heat sink 130 side. The metal layer 150 may be fixed in advance to the lower face 142 of the thermally conductive material 140 before the thermally conductive material 140 is attached to the heat sink 130 and the encapsulating resin 180.

Next, each lead 160 is cut out of the frame body (not illustrated) of the lead frame. Accordingly, the semiconductor device 100 having the structure illustrated in FIG. 1 is obtained.

According to the embodiment thus far, the semiconductor device 100 is provided with the heat sink 130, the semiconductor chip 110 disposed on the first face 131 side of the heat sink 130, the insulating thermally conductive material 140 attached to the second face 132 of the heat sink 130 opposite to the first face 131, and the encapsulating resin 180 encapsulating the semiconductor chip 110 and the heat sink 130.

As described above, as the area of the package of the semiconductor device is larger, the electric field at a place in the faces of the thermally conductive material where the electric field is most concentrated is intensified even if degradation of insulating properties of the thermally conductive material is not actualized as a problem when the package of the semiconductor device is smaller than a certain size. Thus, it is considered that degradation of insulating properties due to slight varying of the film thickness of the thermally conductive material may also be actualized as a problem.

Regarding this point, the semiconductor device 100 according to the present embodiment can be expected to have sufficient insulation reliability by providing the thermally conductive material 140 having the above structure in the semiconductor device 100 even if the semiconductor device 100 is a large-size package such that the mounted floor area of the semiconductor device 100 is greater than or equal to 10×10 mm and less than or equal to 100×100 mm.

The semiconductor device 100 according to the present embodiment can be expected to have sufficient insulation reliability by providing the thermally conductive material 140 having the above structure in the semiconductor device 100 even if the semiconductor device 100 has a structure in which, for example, three or more semiconductor chips 110 are disposed on the first face 131 side of one heat sink 130, and the encapsulating resin 180 encapsulates all of these three or more semiconductor chips, that is, even if the semiconductor device 100 is a large-size package.

When the semiconductor device 100 is further provided with the metal layer 150 of which one face (upper face 151) is fixed to the face (lower face 142) of the thermally conductive material 140 opposite to the heat sink 130 side, heat can be suitably radiated by the metal layer 150. Thus, thermal radiation properties of the semiconductor device 100 are improved.

When the upper face 151 of the metal layer 150 is smaller than the lower face 142 of the thermally conductive material 140, the lower face 142 of the thermally conductive material 140 is exposed to the outside, and it is a concern that the thermally conductive material 140 may be cracked due to protruding objects such as foreign objects. Meanwhile, when the upper face 151 of the metal layer 150 is larger than the lower face 142 of the thermally conductive material 140, an end portion of the metal layer 150 appears to float in the air, and the metal layer 150 may be peeled when, for example, being handled during the manufacturing process.

Regarding this point, providing a structure in which the outline of the upper face 151 of the metal layer 150 overlaps with the outline of the lower face 142 of the thermally conductive material 140 in a plan view can suppress cracking of the thermally conductive material 140 and peeling of the metal layer 150.

The entire lower face 152 of the metal layer 150 is exposed from the encapsulating resin 180. Thus, heat can be radiated from the entire lower face 152 of the metal layer 150, and the semiconductor device 100 has high thermal radiation properties.

Figure 2:
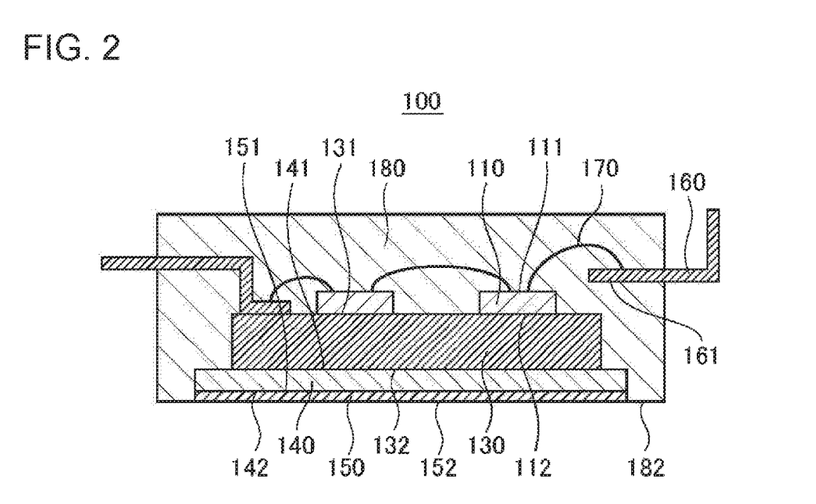
FIG. 2 is a sectional view of the semiconductor device according to one embodiment of the present invention.

FIG. 2 is a sectional view of the semiconductor device 100 according to one embodiment of the present invention.

The semiconductor device 100 is different from the semiconductor device 100 illustrated in FIG. 1 in the following aspect described but in other aspects is configured in the same manner as the semiconductor device 100 illustrated in FIG. 1.

In the present embodiment, the thermally conductive material 140 is encapsulated in the encapsulating resin 180. The metal layer 150 is also encapsulated in the encapsulating resin 180 except for the lower face 152 thereof. The lower face 152 of the metal layer 150 and the lower face 182 of the encapsulating resin 180 are positioned in the same plane.

FIG. 2 illustrates an example in which at least two or more semiconductor chips 110 are mounted on the first face 131 of the heat sink 130. The electrode patterns on the upper faces 111 of the semiconductor chips 110 are electrically connected to each other through the wire 170. For example, total six semiconductor chips 110 are mounted on the first face 131. That is, for example, each of the two semiconductor chips 110 is arranged into three arrays in the depth direction of FIG. 2.

A power module provided with a substrate and the semiconductor device 100 is obtained by mounting the semiconductor device 100 illustrated in FIG. 1 or FIG. 2 on a substrate (not illustrated).

The present invention is not limited to the embodiment above. Modifications, improvements, and the like are included in the present invention to an extent achieving the object of the present invention.

Example

Hereinafter, the present invention will be described with examples and comparative examples, which do not limit the present invention. In the examples, parts represent parts by mass unless otherwise specified. In addition, each thickness is represented as an average film thickness.

(Preparing Agglomerated Boron Nitride)

A mixture obtained by mixing melamine borate and scaly boron nitride powder (average major diameter: 15 μm) is added to an aqueous solution of polyacrylic acid ammonium and is mixed for two hours to prepare a spray slurry. Next, the slurry is supplied to a spray granulator and is sprayed under conditions of a number of rotations of an atomizer of 15000 rpm, a temperature of 200° C., and an amount of supply of the slurry of 5 ml/min, and thus compound particles are prepared. Next, the obtained compound particles are baked under conditions of a nitrogen atmosphere and a temperature of 2000° C., and agglomerated boron nitride having an average particle diameter of 80 μm is obtained.

The average particle diameter of the agglomerated boron nitride is set as the median diameter ($D_{50}$) of a particle size distribution when a particle size distribution of particles is measured by a laser diffraction particle size measuring device (HORIBA, LA-500) on a volume basis.

(Preparing Thermally Conductive Sheet)

The thermally conductive sheet is prepared in Examples 1 to 7 and in Comparative Examples 1 and 2 as follows.

First, according to the mixture illustrated in Table 1, a thermosetting resin and a curing agent are added to methyl ethyl ketone that is a solvent, and these are stirred to obtain a solution of a thermosetting resin compound. Next, an inorganic filler material is put into the solution and is premixed. Afterward, the solution is milled by a three roll mill to obtain a resin compound for a thermally conductive sheet in which the inorganic filler material is uniformly dispersed. Next, the obtained resin compound for a thermally conductive sheet is aged under conditions of a temperature of 60° C. and a time of 15 hours. Next, the resin compound for a thermally conductive sheet is applied onto a copper foil by using a doctor blade and is dried through heating at 100° C. for 30 minutes to prepare a B-stage thermally conductive sheet having a film thickness of 400 µm.

Details of each component in Table 1 are as follows.

In Comparative Example 3, a thermally conductive sheet is prepared in the same manner as Example 1 except that the resin compound for a thermally conductive sheet is not aged.

Details of each component in Table 1 are as follows.

(Thermosetting Resin (A))

Epoxy Resin 1: epoxy resin having a dicyclopentadiene skeleton (Nippon Kayaku, XD-1000)

Epoxy Resin 2: epoxy resin having a biphenyl skeleton (Mitsubishi Chemical Corporation, YX-4000)

Epoxy Resin 3: epoxy resin having an adamantane skeleton (Idemitsu Kosan, E201)

Epoxy Resin 4: epoxy resin having a phenol aralkyl skeleton (Nippon Kayaku, NC-2000-L)

Epoxy Resin 5: epoxy resin having a biphenyl aralkyl skeleton (Nippon Kayaku, NC-3000)

Epoxy Resin 6: epoxy resin having a naphthalene aralkyl skeleton (Nippon Kayaku, NC-7000)

Epoxy Resin 7: bisphenol F epoxy resin (DIC Corporation, 830S)

Epoxy Resin 8: bisphenol A epoxy resin (Mitsubishi Chemical Corporation, 828)

Cyanate Resin 1: phenol novolac cyanate resin (Lonza Japan, PT-30)

(Curing Catalyst C-1)

Curing Catalyst 1: 2-phenyl-4,5-dihydroxymethylimidazole (Shikoku Chemicals, 2PHZ-PW)

Curing Catalyst 2: triphenylphosphine (Hokko Chemical Industry)

(Curing Agent C-2)

Phenol-based Curing Agent 1: tris phenyl methane phenol novolac resin (Meiwa Plastic Industries, MEH-7500)

(Inorganic Filler Material (B))

Filler Material 1: agglomerated boron nitride prepared by the preparation example above (Measuring Tg (Glass Transition Temperature))

The glass transition temperature of the cured product of the thermally conductive sheet is measured as follows. First, the cured product of the thermally conductive sheet is obtained by heating the obtained thermally conductive sheet at 180° C. under 10 MPa for 40 minutes. Next, the glass transition temperature (Tg) of the cured product obtained is measured through dynamic viscoelasticity measurement (DMA) under conditions of a rate of temperature increase of 5° C./min and a frequency of 1 Hz.

(Measuring Total Amount of Ions)

The total amount of the ions in the cured product of the thermally conductive sheet is measured as follows. First, the cured product of the thermally conductive sheet is obtained by heating the obtained thermally conductive sheet at 180° C. under 10 MPa for 40 minutes. Next, the cured product obtained is cryogenically ground. 40 mL of pure water is added to 2 g of the cryogenically ground thermally conductive sheet, and hot water extraction is performed at 125° C. for 20 hours to obtain extracted water.

In the extracted water, the total amount of ions of one or two or more selected from $Li^+$, $Na^+$, $NH_4^+$, $K^+$, $Ca^+$, $Mg^{2+}$, $F^-$, $Cl^-$, $NO_2^-$, $Br^-$, $NO_3^-$, $P_4^{3-}$, $SO_4^{2-}$, $(COO)_2^{2-}$, $CH_3COO^-$, and $HCOO^-$ is measured by using ICS-3000, ICS-2000, and DX-320 ion chromatography devices manufactured by Dionex.

A test liquid and a standard solution are introduced into the ion chromatography devices to obtain the concentration of each ion by a calibration curve method, and the amount of ions eluted from a sample is computed.

(Measuring Volume Resistivity at 25° C. and at 175° C.)

The volume resistivity of the cured product of the thermally conductive sheet is measured as follows. First, the cured product of the thermally conductive sheet is obtained by heating the obtained thermally conductive sheet at 180° C. under 10 MPa for 40 minutes. Next, on the basis of JIS K 6911, the volume resistivity of the cured product obtained is measured one minute later after an applied voltage of 1000 V is applied thereto by using Ultra High Resistance Meter R8340A (manufactured by ADC).

The main electrode is prepared into a circular shape having a diameter of p 25.4 mm by using conductive paste. At this time, the guard electrode is not created. The copper foil that is used as a base material at the time of creating the sheet is used as the counter electrode.

(Evaluating Insulation Reliability)

Insulation reliability of the semiconductor package is evaluated as follows in each of Examples 1 to 7 and in each of Comparative Examples 1 to 3. First, the semiconductor package illustrated in FIG. 1 is prepared by using the cured product of the thermally conductive sheet. Next, insulation resistance in continuous humidity is evaluated under conditions of a temperature of 85° C., a humidity of 85%, and an applied alternating current voltage of 1.5 kV by using the semiconductor package. A resistance value less than or equal to $10^6 \Omega$ is defined as a failure. Evaluation criteria are as follows.

AA: No failure occurs in 300 or more hours.

A: Failure occurs in 200 or more hours and less than 300 hours.

B: Failure occurs in 150 or more hours and less than 200 hours.

C: Failure occurs in 100 or more hours and less than 150 hours.

D: Failure occurs in less than 100 hours.

The semiconductor packages of Examples 1 to 7 in which the thermally conductive sheet having the volume resistivity at a temperature of 175° C. within the above range of the present invention is used have excellent insulation reliability.

Meanwhile, the semiconductor packages of Comparative Examples 1 to 3 in which the thermally conductive sheet having the volume resistivity at a temperature of 175° C. outside of the above range of the present invention is used have inferior insulation reliability.

TABLE 1

| | | | Unit | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|---|---|---|
| Resin Composition | Thermosetting Resin | Epoxy Resin 1 | g | 18.9 | — | — | — | — | — | — | — | — | 18.9 |
| | | Epoxy Resin 2 | g | — | 9.0 | 8.6 | — | — | — | 12.9 | — | — | — |
| | | Epoxy Resin 3 | g | — | — | 8.9 | — | — | — | — | — | — | — |
| | | Epoxy Resin 4 | g | — | — | — | 18.6 | — | — | — | — | — | — |
| | | Epoxy Resin 5 | g | — | — | — | — | 19.4 | — | — | — | — | — |
| | | Epoxy Resin 6 | g | — | — | — | — | — | 18.4 | — | — | — | — |
| | | Epoxy Resin 7 | g | — | — | — | — | — | — | — | 16.8 | — | — |
| | | Epoxy Resin 8 | g | — | — | — | — | — | — | — | — | 17.4 | — |
| | | Cyanate Resin 1 | g | — | — | — | — | — | — | 12.9 | — | — | — |
| | Curing Agent | Phenol-based Curing Agent 1 | g | 7.3 | 17.2 | 8.8 | 7.6 | 6.8 | 7.8 | — | 9.4 | 8.9 | 7.3 |
| | | Curing Catalyst 1 | g | 0.1 | 0.1 | 0.1 | 0.1 | 0.1 | 0.1 | — | 0.1 | 0.1 | 0.1 |
| | | Curing Catalyst 2 | g | — | — | — | — | — | — | 0.5 | — | — | — |
| | Inorganic Filler Material | Filler Material 1 | g | 73.8 | 73.8 | 73.8 | 73.8 | 73.8 | 73.8 | 73.8 | 73.8 | 73.8 | 73.8 |
| Glass Transition Temperature (Tg) | | | °C. | 197 | 185 | 221 | 169 | 167 | 190 | 288 | 166 | 170 | 195 |
| Volume Resistivity (25° C.) | | | Ω·m | 1.8E+12 | 1.6E+12 | 7.1E+11 | 1.7E+12 | 3.2E+11 | 1.9E+12 | 1.8E+13 | 1.4E+12 | 1.1E+12 | 2.0E+12 |
| Volume Resistivity (175° C.) | | | Ω·m | 4.5E+10 | 1.2E+09 | 1.4E+10 | 4.7E+09 | 3.2E+09 | 2.7E+09 | 4.1E+11 | 7.5E+06 | 1.3E+07 | 9.7E+07 |
| Total Amount of Ions | | | ppm | 12700 | 8390 | 19500 | 17500 | 16500 | 14000 | 19000 | 22000 | 20000 | 14700 |
| Insulation Reliability Evaluation | | | — | AA | A | A | B | B | A | A | D | D | C |

This application is based on and claims the benefit of priority from Japanese Patent Application No. 2014-018633 filed on Feb. 3, 2014, the entire disclosure of which is incorporated herein.

The invention claimed is:

1. A thermally conductive sheet comprising:
a thermosetting resin; and
an inorganic filler material which is dispersed in the thermosetting resin,
wherein the volume resistivity of the cured product of the thermally conductive sheet, which is measured one minute later after an applied voltage of 1000 V is applied thereto on the basis of JIS K 6911 and at a temperature of 175° C., is greater than or equal to $1.0 \times 10^8$ Ω·m,
the thermosetting resin is one or two or more selected from an epoxy resin having a dicyclopentadiene skeleton, an epoxy resin having a biphenyl skeleton, an epoxy resin having an adamantane skeleton, an epoxy resin having a phenol aralkyl skeleton, an epoxy resin having a biphenyl aralkyl skeleton, an epoxy resin having a naphthalene aralkyl skeleton, and a cyanate resin, and
the inorganic filler material is secondary agglomerated particles that are configured of primary particles of scaly boron nitride,
wherein the average particle diameter of the secondary agglomerated particles is greater than or equal to 5 um and less than or equal to 180 um, and
the average major diameter of the primary particles constituting the secondary agglomerated particles is greater than or equal to 0.01 um and less than or equal to 20 μm, wherein the thermally conductive sheet has been subject to an aging treatment at a temperature of 30° C. to 80° C. for a time period of 12 to 24 hours.

2. The thermally conductive sheet according to claim 1 wherein the volume resistivity is greater than or equal to $1.0 \times 10^9$ Ω·m.

3. The thermally conductive sheet according to claim 1, wherein the total amount of ions in the cured product of the thermally conductive sheet is less than or equal to 30,000 ppm, which is measured by performing ion chromatography analysis on extracted water that is obtained under a condition, and
the ions are one or two or more selected from $Li^+$, $Na^+$, $NH^{4+}$, $K^+$, $Ca^{2+}$, $Mg^{2+}$, $F^-$, $Cl^-$, $NO_2^{2-}$, $Br^-$, $NO_3^-$, $PO_4^{3-}$, $SO_4^{2-}$, $(COO)_2^{2-}$, $CH_3COO^-$, and $HCOO^-$,
wherein the condition is one made by adding 40 mL of pure water to 2 g of the cryogenically ground cured product of the thermally conductive sheet, followed by performing hot water extraction at 125° C. for 20 hours to obtain the extracted water.

4. The thermally conductive sheet according to claim 1, wherein a glass transition temperature of the cured product of the thermally conductive sheet is greater than or equal to 175° C., which is measured through dynamic viscoelasticity measurement under conditions of a rate of temperature increase of 5° C./min and a frequency of 1 Hz.

5. The thermally conductive sheet according to claim 1, wherein the content of the inorganic filler material is greater than or equal to 50 mass % and less than or equal to 95 mass % with respect to the thermally conductive sheet as 100 mass %.

6. A semiconductor device comprising:
a metal plate;
a semiconductor chip that is disposed on a first face side of the metal plate;
a thermally conductive material that is bonded to a second face of the metal plate opposite to the first face; and
an encapsulating resin that encapsulates the semiconductor chip and the metal plate,
wherein the thermally conductive material is formed by the thermally conductive sheet according to claim 1.

* * * * *